United States Patent [19]

Keys et al.

[11] Patent Number: 4,965,152
[45] Date of Patent: Oct. 23, 1990

[54] HOLOGRAPHIC NOTCH FILTERS

[75] Inventors: Dalen E. Keys, Wilmington; William K. Smothers, Hockessin; Torence J. Trout, Yorklyn, all of Del.

[73] Assignee: E. I. Du Pont de Nemours and Company, Wilmington, Del.

[21] Appl. No.: 380,184

[22] Filed: Jul. 14, 1989

Related U.S. Application Data

[63] Continuation-in-part of Ser. No. 144,840, Jan. 15, 1988, abandoned.

[51] Int. Cl.⁵ .......................... G03H 1/04; G03H 1/06
[52] U.S. Cl. ............................................ 430/1; 430/2; 430/281; 430/912; 350/3.61; 350/3.65; 350/3.67
[58] Field of Search ........................ 430/1, 2, 281, 290, 430/912; 350/3.61, 3.65, 3.67, 162.15, 162.23

[56] References Cited

U.S. PATENT DOCUMENTS

| | | | |
|---|---|---|---|
| 3,685,526 | 4/1972 | Haugh | 430/1 |
| 3,809,732 | 5/1974 | Chandross et al. | 264/22 |
| 3,993,485 | 11/1976 | Chandross et al. | 96/27 H |
| 4,173,474 | 11/1979 | Tanaka et al. | 430/1 |
| 4,535,041 | 8/1985 | Fielding et al. | 430/1 |
| 4,786,125 | 11/1988 | Magarinos et al. | 350/3.65 |
| 4,802,719 | 2/1989 | Magarinos et al. | 350/3.7 |

OTHER PUBLICATIONS

Wopschall et al., "Dry Photopolymer Film of Recording Holograms," Applied Optics, 9/72, pp. 2096–2097.
W. C. Hay and B. D. Guenther, "Characterization of Polaroid's DMP-128 Holographi Recording Photopolymer", SPIE vol., 883, Holographic Optics: Design and Applications, (1988), pp. 102–105.
R. T. Ingwall and M. Troll, "The Mechanism of Hologram Formation in DMP-128 Photopolymer", SPIE vol. 883, *Holographic Optics: Design and Applications*, (1988), pp. 94–101.

*Primary Examiner*—Paul R. Michl
*Assistant Examiner*—Patrick Doody

[57] ABSTRACT

Holographic notch filters are provided that comprise photopolymer films, having an optical density of at least 2, mounted on a transparent substrate.

21 Claims, 1 Drawing Sheet

HOLOGRAPHIC NOTCH FILTERS

CROSS REFERENCE TO RELATED APPLICATIONS

This application is a continuation-in-part of Serial No. 144,840, Process of Forming Reflection Holograms in Photopolymerizable Layers, filed Jan. 15, 1988, now abandoned.

FIELD OF THE INVENTION

This invention relates to reflective holographic optical elements, and more particularly, to improved holographic notch filters that employ a photopolymer film imaged to contain a reflection holographic mirror.

BACKGROUND OF THE INVENTION

In military situations, the eyes of personnel and the detectors of sensitive optical instruments, such as sensors, need protection from damaging laser radiation. The damage can be intentional from offensively used lasers, or inadvertent, as from lasers used for range finders, targeting, and measuring devices. In non-military situations, it is necessary to provide protection from laser radiation to individuals working near or with laser containing equipment. The radiation may be in the ultraviolet, visible, or the infra-red regions of the spectrum.

To be effective these protective filters must have a high optical density at the selected wavelength, a narrow spectral bandwidth, maximum transmission outside the selected band, and excellent optical properties. The rejection maximum of the filter should closely correspond to the wavelength to be rejected. Strong rejection of a narrow, selected portion of the spectrum allows protection from discrete laser lines yet allows for good photopic transmission, or visibility, since the rest of the spectrum passes through the filter.

In many situations it is also necessary for the filter to provide protection against several wavelengths. In practical situations it is frequently necessary for the filter to offer protection from a wide range of incident angles. This is accomplished with proper optical design of the filter and the use of sufficient bandwidth. In general, there is a trade-off between design, angular bandwidth, and photopic transmission.

In addition to the optical requirements, a rugged environmentally stable technology is required. The filter must not change its optical properties under a wide variety of environmental conditions. It is also desirable for the filter to be compatible with a variety of different substrates including different glasses and plastics such as polycarbonate. Polycarbonate is the preferred substrate for military applications because it is light weight and also offers ballistic protection.

Current filter technologies include: absorbing dyes, phosphate glasses, dielectric coatings, and reflective holographic optical elements. Absorbing dyes have several drawbacks: reduced photopic transmission due to broad absorption bands and decrease in absorption due to photobleaching and/or photodegradation. Phosphate glasses are useful for only limited regions of the visible spectrum and, thus, can not be used to prepare filters which provide protection against both visible and infra-red laser radiation. Both dielectric coatings and reflective holographic optical elements offer the advantages of high optical density and narrow band rejection. Dielectric coatings, however, are expensive, difficult to manufacture, and can not readily be attached to complex optical surfaces. Reflective holographic optical elements also offer the additional advantage of complex refractive design. This design, which allows protection from a wide range of incident angles, is not possible with either dielectric coatings or the other types of filters.

Dichromated gelatin is currently the material of choice for the manufacture of reflective holographic optical elements due to high diffraction efficiency and low noise characteristics. However, the material has poor shelf life and requires wet processing. Wet processing may cause the holographic notch filter to change during processing due to the swelling and shrinking of the gelatin during processing thus changing it optical properties and introducing optical aberrations. Thus, it is difficult and time consuming to reproducibly make high quality holographic notch filters with dichromated gelatin. In addition, due to moisture sensitivity of the gelatin, the holographic notch filter must be hermetically sealed against moisture. This is particularly difficult to achieve when polycarbonate or other plastic substances are used due to the moisture porosity of these substrates. Dichromated gelatin is also difficult to coat onto polycarbonate in multilayer configurations which are needed for filters that reject more than one laser line.

Substantially solid, photopolymer films have heretofore been proposed for making holograms. Haugh U.S. Pat. No. 3,658,516, for instance, discloses the preparation of stable, high resolution holograms from solid, photopolymerizable films by a single step process wherein a permanent refractive index image is obtained by a single exposure to a coherent radiation source bearing holographic information. The holographic image thus formed is not destroyed by subsequent uniform exposure to light, but rather is fixed or enhanced.

Despite the many advantages of the materials proposed by Haugh, they offer limited holographic response and application has been limited to transmission holograms where the holographic image is viewed by light transmitted through the imaged material. Moreover, the materials proposed by Haugh have little or no reflection efficiency when imaged to form a reflection hologram.

Thus, a need continues to exist for materials for improved laser protective filters, particularly materials for holographic notch filters. These materials must have excellent optical and holographic properties, must permit ease of manufacture and the production of reproducible holographic mirrors, must be compatible with a variety of substrates including glass and polycarbonate, and must have excellent environmental stability. In addition, they must be capable of being imaged on another substrate and transferred to the final substrate and being imaged directly on the final substrate. They must also be capable of being coated or laminated in multilayer configurations.

SUMMARY OF THE INVENTION

It has now been found that certain photopolymer films, when imaged with coherent light to form holographic mirrors, will have a refractive index modulation greater than 0.01 and are particularly suited for use in holographic notch filters. Accordingly, the present invention provides a holographic notch filter comprising a transparent substrate that bears a transparent polymeric film containing a mirror formed by a reflection hologram, said film having a refractive index modulation greater than approximately 0.01 and being formed by exposing to coherent light a composition consisting essentially of:

(a) approximately 25 to 75% of a polymeric binder selected from the group consisting of polyvinyl acetate, polyvinyl butyral, polyvinyl acetal, polyvinyl formal, interpolymers containing major segments thereof, and mixtures thereof;

(b) approximately 5 to 60% of an ethylenically unsaturated monomer selected from the group consisting of carbazole containing monomers and a liquid monomer containing one or more phenyl, biphenyl, phenoxy, naphthyl, naphthloxy, heteroaromatic groups containing up to three aromatic rings, chlorine and bromine;

(c) approximately 0 to 25% of a plasticizer; and (d) approximately 0.1 to 10% of a photoinitiator system activatable by actinic radiation;

wherein said percentages are weight percentages based on total film weight.

While the optical density required for an effective holographic notch filter varies with the application, the power of the radiation source, and the wavelength to be rejected, holographic notch filters having an optical density of about 2 (99% rejection), and preferably at least 3 (99.9% rejection) or greater, at the wavelengths to be rejected are particularly useful.

Generally the film will be imaged with coherent radiation prior to being laminated to the permanent substrate, such as polycarbonate or glass, but it may be imaged after lamination if so desired. Lamination is generally accomplished through the application of heat and/or pressure; transparent adhesives also may used to achieve permanent bonding of the film to the substrate, if so desired. An overcoat or protective layer may be added to protect the film from damage due to abrasion.

DETAILED DESCRIPTION OF THE INVENTION

Figure 1:
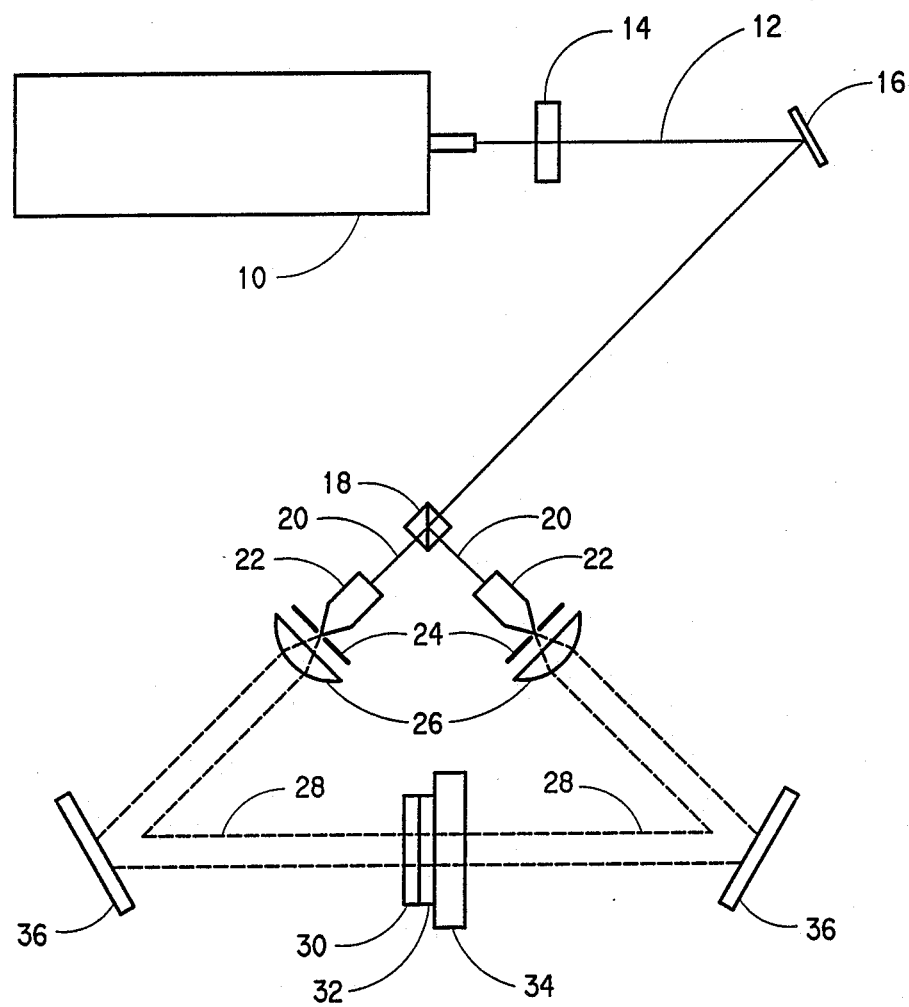
FIG. 1 illustrates an off-axis method of forming a reflection holographic mirror.

In practicing the invention, the photosensitive composition described hereinafter is first casT or laminated to a transparent support that provides structural integrity for the composition (referred to herein as a film) as it is processed to form a holographic notch filter. Since the photosensitive film typically will be only 1 to 100 micrometers in thickness, the support is necessary to prevent film rupture or any stretching or distortion during processing that would affect spacing of the interference fringes forming the holographic mirror.

Also, the support must be sufficiently flexible that it will not separate from the film as the film is brought into contact with its permanent mounting surface, which may be a non-planar substrate such as an eyeglass lens or helmet visor. Less, if any, flexibility will be needed if the permanent mounting surface is planar, such as a sheet of glass. Exemplary transparent supports which may be selected to advantage include polyethylene terephthalate film, polymethyl methacrylate, polycarbonate, and cellulose triacetate.

POLYMERIC FILM

The polymeric film is substantially solid, transparent, and sufficiently flexible that it can be brought into intimate contact with the surface (e.g., an eyeglass lens, the lens of a sensor, a glass sheet, etc.) to which it will be mounted. Components of the film include a binder, an ethylenically unsaturated monomer, optionally a plasticizer, and a photoinitiator system. Upon exposure to coherent radiation as described hereinafter, the monomer in exposed areas polymerizes. Although the film is substantially solid, components interdiffuse during and after exposure to coherent radiation until they are fixed by a final uniform exposure to actinic radiation or by a thermal treatment at elevated temperatures.

The film typically has a thickness of approximately 1 to 100 micrometers. Thinner films will generally not achieve useful optical densities. The amount of radiation which the film will reflect (i.e., reject) at a given wavelength and a given angle is determined by the thickness and refractive modulation index of the film and by the optical design. Thus, the hologram thickness is matched to the application and the power of the source from which protection is desired. In general, thicker films and films with higher refractive index modulations will be selected to provide protection from higher power radiation sources or to provide greater angular coverage.

BINDER

The binder is the most significant component affecting physical properties of a substantially dry photopolymerizable film or layer. The binder serves as a matrix for the monomer and photoinitiator system prior to exposure and, after exposure, contributes to the physical and refractive index characteristics needed to form a holographic mirror. Cohesion, adhesion, flexibility, miscibility, tensile strength, in addition to index of refraction, are some of the properties to be considered in selecting the binder for a specific application. Binders that may be selected to advantage in practicing the invention include polyvinyl acetate, polyvinyl butyral, polyvinyl acetal, polyvinyl formal, interpolymers containing major segments thereof, and mixtures thereof.

Polymers of these materials may contain comonomers or substituent groups that modify the chemical or mechanical properties of the binder. For example, ethyl vinyl ether may be copolymerized with the monomer to modify properties of the polymer such as solubility, compatibility, adhesion, flexibility or hardness.

It also has been found that the inclusion of fluorine, bonded to the binder polymer, improves refractive index modulation values obtained after the film has been holographically imaged. Fluorine may be introduced by esterification, acetalization, ketalization or condensation reactions with the binder or, more conveniently, by copolymerizing a monomer such as a perfluorinated monomer, vinyl fluoride, or vinylidene fluoride, using conventional free radical polymerization techniques. Fluorine containing binders, such as copolymers and terpolymers of vinyl acetate and tetrafluoroethylene and/or hexafluoropropylene, may be selected to advantage when it is desired to achieve a high refractive index modulation, such as 0.06 to 0.075.

MONOMERS

The film will contain at least one ethylenically unsaturated monomer that is capable of free radical initiated addition polymerization to produce a polymeric material having a refractive index substantially different from that of the binder. The monomer usually will contain the unsaturated group in the terminal position. A liquid monomer will generally be selected, but solid monomers can be used to advantage, either individually or in combination with one or more liquid monomers, provided the solid monomer is capable of interdiffusion in the substantially solid film composition.

Ethylenically unsaturated monomers useful in the practice of this invention are are solid ethylenically unsaturated carbazole monomers (e.g., N-vinyl carbazole) and/or liquid, ethylenically unsaturated compounds capable of addition polymerization and having a boiling point above 100° C. The monomer contains either a phenyl, biphenyl, phenoxy, naphthyl, naphthyloxy, and heteroaromatic groups containing up to three aromatic rings; chlorine; and bromine. The monomer contains at least one such moiety and may contain two or more of the same or different moieties of the group. Contemplated as equivalent to the groups are substituted groups where the substitution may be lower alkyl, alkyoxy, hydroxy, cyano, phenyl, phenoxy, carboxy, carbonyl, amino, amido, imido or combinations thereof, provided that the monomer remains liquid and diffusable in the photopolymerizable layer.

Preferred liquid monomers are: 2-phenoxyethyl acrylate, 2-phenoxyethyl methacrylate, phenol ethoxylate monoacrylate, 2-(p-chlorophenoxy)ethyl acrylate, p-chlorophenyl acrylate, phenyl acrylate, 2-phenylethyl acrylate, 2-(1-naphthyloxy)ethyl acrylate, o-biphenyl methacrylate, o-phenyl acrylate, and mixtures thereof.

While most monomers useful in this invention are liquids, they may be used in admixture with one or more ethylenically unsaturated solid monomers such as the ethylenically unsaturated carbazole monomers disclosed in H. Kamogawa, et al., *Journal of Polymer Science: Polymer Chemistry Edition*, Vol. 18 (1979), pp 9–18; 2-naphthyl acrylate; pentachlorophenyl acrylate; 2,4,6-tribromophenyl acrylate; bisphenol A diacrylate; 2-(2-naphthyloxy)ethyl acrylate; N-phenyl maleimide; p-biphenyl methacrylate; 2-vinylnaphthalene; 2-naphthyl methacrylate; N-phenyl methacrylamide; and t-butylphenyl methacrylate.

Ethylenically unsaturated carbazole monomers containing a vinyl group attached to the nitrogen atom of the carbazole moiety typically are solids. Suitable monomers of this type include N-vinyl carbazole and 3,6-dibromo-9-vinyl carbazole. A particularity preferred mixture of ethylenically unsaturated monomers comprises N-vinyl carbazole in combination with one or more of the above liquid monomers, in particular, with 2-phenoxyethyl acrylate, phenol ethoxylate monoacrylate, ethoxylated bisphenol A diacrylate, or mixtures thereof.

If crosslinking of the photopolymer is desired, up to about five weight percent of at least one multifunctional monomer containing two or more terminal ethylenically unsaturated groups may be incorporated into the composition. The polyfunctional monomer must be compatible with the other components of the composition and is preferably a liquid. Suitable multifunctional monomers include di-(2-acryloxyethyl)ether of bisphenol A, ethoxylated bisphenol A diacrylate, triethylene glycol diacrylate, trimethylol propane triacrylate, and the like. A preferred crosslinking for use in the compositions of this invention is ethoxylated bisphenol A diacrylate.

PHOTOINITIATOR SYSTEM

The initiator system comprises one or more compounds which directly furnish free-radicals when activated by actinic radiation. By "actinic radiation" is meant radiation which is active to produce the free-radicals necessary to initiate polymerization of the monomeric material. It can also comprise a plurality of compounds, one of which yields the free-radicals after having been caused to do so by another compound, or sensitizer, which is activated by the radiation. Photoinitiator systems useful in practicing this invention typically will contain a photoinitiator and a sensitizer which extends the spectral response into the near ultraviolet, the visible, and/or near infrared spectral regions.

A large number of free-radical generating compounds can be utilized in the practice of this invention. Redox systems, especially those involving dyes, e.g., Rose Bengal/2-dibutylaminoethanol, may be used. Photoreducible dyes and reducing agents, as well as dyes of the phenazine, oxazine, and quinone classes; ketones; quinones; dye-borate complexes as disclosed in U.S. Pat. No. 4,772,541; dye sensitized azinium salts disclosed in U.S. Pat. No. 4,743,531; and trichloromethyl triazines as disclosed in U.S. Pat. Nos. 4,772,534 and 4,774,163 can be used to initiate photopolymerization. A useful discussion of dye sensitized photopolymerization can be found in "Dye Sensitized Photopolymerization" by D. F. Eaton in *Adv. in Photochemistry*, Vol. 13, D. H. Volman, G. S. Hammond, and K. Gollinick, eds., Wiley-Interscience, New York, 1986, pp. 427–487.

Preferred initiator systems are 2,4,5-triphenylimidazolyl dimers with chain transfer agents, or hydrogen donors, and mixtures thereof, sensitized by visible sensitizers. Preferred 2,4,5-triphenylimidazolyl dimers include CDM-HABI, i.e., 2-(o-chlorophenyl)-4,5-bis(m-methoxyphenyl)-imidazole dimer; o-Cl-HABI, i.e., 1,1'biimidazole, 2,2'-bis (o-chlorophenyl)-4,4'5,5'-tetraphenyl-; and TCTM-HABI, i.e., 1H-imidazole, 2,5-bis(o-chlorophenyl)-4-[3,4-dimethoxyphenyl]-, dimer each of which is typically used with a hydrogen donor.

A preferred group of sensitizers include the bis(p-dialkylaminobenzylidine) ketones disclosed in Baum and Henry, U.S. Pat. No. 3,652,275 and the arylyidene aryl ketones disclosed in Dueber, U.S. Pat. No. 4,162,162. Particularly preferred sensitizers include the following: DEAW, i.e., cyclopentanone, 2,5-bis[4-(diethylamino)phenyl]methylene]-, CAS 38394-53-5; JAW, i.e., cyclopentanone, 2,5-bis[(2,3,6,7-tetrahydro-1H, 5H-benzo[i, j]quinolizin-9-yl)methylene]-; cyclopentanone, 2,5-bis[2-(1,3-dihydro-1,3,3-trimethyl-2H-indol-2-ylidene)ethylidene], CAS 27713-85-5; and cyclopentanone, 2,5-bis-[2-ethylnaphtho[1,2-d]thiazol-2(1H)-ylidene)ethylidene], CAS 27714-25-6.

Suitable hydrogen donors include: 2-mercaptobenzoxazole, 2-mercaptobenzothiazole, 4-methyl-4H-1,2,4, triazole-3-thiol, and the like. Other suitable hydrogen donor compounds, which are preferred for compositions which contain N-vinyl carbazole monomer, are 5-chloro-2-mercaptobenzothiazole; 2-mercaptobenzothiazole; 1H-1,2,4-triazole-3-thiol; 6-ethoxy-2-mercaptobenzothiazole; 4-methyl-4H-1,2,4-triazole-3-thiol; 1-dodecanethiol; and mixtures thereof.

OTHER COMPONENTS

Other components conventionally added to photpolymer compositions can be present to modify the physical properties of the film. Such components include: plasticizers, thermal stabilizers, optical brighteners, photostabilizers, adhesion modifiers, coating aids, and release agents.

A plasticizer may be present to modify adhesion, flexibility, hardness, and other physical and mechanical properties of the film in a conventional fashion. Candidate plasticizers include triethylene glycol dicaprylate, triethylene glycol bis(2-ethylhexanoate), diethyl adipate, dibutyl adipate, tetraethylene glycol diheptanoate, dibutyl suberate, diethyl sebacate, tris(2-ethylhexyl)-phosphate, glyceryl tributyrate, Brij®, 30 $[C_{12}H_{25}(OCH_2CH_2)_4OH]$, and Brij®, 35 $[C_{12}H_{25}(OCH_2CH_2))_{20}OH]$. Other plasticizers that yield equivalent results will be apparent to those skilled in the art.

In case in which a mixture of a solid and a liquid monomer are present, it will also be appreciated that plasticizer may be substituted for some or all of the liquid monomer, provided that the mixture of plasticizer and monomer remains liquid. It will also be appreciated that a mixture of plasticizer and solid monomer may be used, provided that the mixture of plasticizer and monomer remains liquid.

Normally a thermal polymerization inhibitor will be present to improve the storage stability of the photopolymerizable composition. Useful thermal stabilizers include: hydroquinone, phenidone, p-methoxyphenol, alkyl and aryl-substituted hydroquinones and quinones, t-butyl catechol, pyrogallol, beta-naphthol, 2,6-di-t-butyl-p-cresol, phenothiazine, and chloranil. The dinitroso dimers described in Pazos, U.S. Pat. No. 4,168,982, are also useful. Since monomers generally contain thermal polymerization inhibitors added by their manufacturers, it is frequently unnecessary to add additional inhibitor.

Nonionic surfactants may be added to the photopolymerizable composition as coating aids. Preferred coating aids are fluorinated nonionic surfactants, such as Fluorad®, FC-430 and Fluorad®, FC-431.

COMPOSITION

Proportions of ingredients in the photopolymerizable composition will generally be within the following percentage ranges, based on the total weight of the composition: binder 25 to 90%, preferably 45 to 75%; monomer(s), 5 to 60%, preferably, 15 to 50%; plasticizer, 0 to 25%, preferably, 0 to 15%; photoinitiator system, 0.1 to 10%, preferably 1 to 7%; and optional ingredients, 0 to 5%, typically 1 to 4%. If the amount of binder is below approximately 25%, or the amount of monomer exceeds approximately 60%, the composition has insufficient viscosity to form a solid film. At high levels of binder addition, exceeding approximately 90%, performance is unduly lost, and the resulting films have diminished values of refractive index modulation. Likewise, levels of monomer(s) used will be at least approximately 5% since lower quantities will not produce films having practical values of refractive index modulation.

SUPPORT/COATING

The improved photopolymerizable compositions of this invention are substantially solid and are typically used as a layer applied to a support. The composition may be directly coated onto the support by any conventional method, such as is described herein, or may be cast as a film and laminated to the support by conventional methods. In either case the support generally provides only temporary dimensional stability for the photopolymer film prior to mounting on its permanent substrate, and thus the support is releasable from the film. For some applications, however, it may be desired to retain the support as a permanent overcoat or protective layer for the photopolymer film, in which case the support and the photopolymer film may be permanently bonded. In other cases it may be desirable to coat the film directly onto the permanent substrate, thus avoiding the transfer step.

The support is dimensionally stable and, if exposure is to be carried out through the support, transparent to actinic radiation. In addition, if thermal processing is to be carried out with the support in place, the support must be stable to the thermal processing conditions. Candidate support materials are glass, quartz, and transparent polymer films. A preferred support material is polyethylene terephthalate film. The other side of the supported photopolymerizable layer may have a temporary protective coversheet releasably adhered thereto, e.g., polyethylene, polypropylene, polyethylene terephthalate, etc. Typically the coversheet has the weaker adherence to the photopolymerizable layer and the support has the stronger adherence. Conventional intermediate layers or coatings may be used to facilitate the adhesive and/or release characteristics needed for the preformed element.

EXPOSURE OF THE FILMS

Referring to FIG. 1, holographic mirrors may be formed, using the "off-axis" technique, by exposing the films to the intersection of two counter propagating laser beams. The laser (10) produces a laser beam (12) which is controlled by a shutter (14). The laser beam (12) is directed by a mirror (16) into a beam splitter (18) wherein the beam is divided into two equal beam segments (20). Each beam segment (20) passes through a microscope objective (22), pinhole (spacial filter) (24), and collimating lens (26) to produce an expanded, collimated beam (28). Each expanded, collimated beam (28) is reflected by a mirror (36) to converge in the photopolymerizable layer (32). The photopolymerizable layer (32) is mounted on a glass plate (34) and protected by a polyethylene terephthalate film support (30).

Interference fringes are created within the photopolymerizable layer by intersecting the two beams in the layer. In the embodiment shown in FIG. 1, this is achieved by tilting the glass plate to an angle of 5° to 70° from the line perpendicular to the axis of the two beams. The interference fringes thereby created in the photopolymer are slanted (i.e., the fringes are at an angle to the film plane). The fringes function as a mirror for light having a wavelength similar to that used to form the fringes, and impacting the film at the same angle that was used to form the fringes.

Alternatively, one may use an "on-axis" technique for imaging the film. In this case a coherent beam of light, such as a collimated 488 nm argon-ion laser beam, is projected onto one surface of the film, typically at an angle up to 70° from the normal to the film plane. The collimated beam in part functions as a "reference beam", while a portion is transmitted through the layer and reflected back by a mirror mounted behind the film, thereby functioning as an "object beam". Intersection of the reference beam and object beam, in the film, forms interference fringes that are oriented substantially parallel to the film plane. These fringes form a reflection hologram, which functions as a mirror, when viewed with light projected on the front surface of the film. A potential difficulty with the "on-axis" mode of operation may occur if the film and its support absorb a substantial portion of the beam used to image the film, in which case the reflected object beam may be too weak to form a satisfactory hologram. If this should occur, however, the film formulation is readily adjusted to minimize the problem.

It has been found to be advantageous to preheat the film, and then image the film while it still is at an elevated temperature. In this embodiment the film is heated to a moderate temperature, typically in the range of approximately 30° to 50° C., and then exposed to the coherent light source while the film is still warm. Preheating has been found to improve reflection efficiency of the imaged film and to increase photospeed. Thus, preheating permits use of a lower energy laser and/or allows the imaging step to be completed more quickly.

After the holographic mirror has been formed by either of these techniques, the image is fixed by flooding the film with actinic radiation. This may be achieved by exposing the film to normal room light, but it is preferred to flood the surface with higher intensity visible light and/or ultraviolet light, to complete polymerization of the monomer component of the film.

The reflection holographic mirrors described above have improved reflection efficiency compared to prior art photopolymer compositions of Haugh. Whereas the Haugh formulations typically have a reflection efficiency less than 10%, reflection efficiencies above 60% are readily obtained with the films and processes described above. If the film does not have a high enough reflection efficiency for notch filter applications (i.e., a reflection efficiency of at least 99% - optical density of 2), the efficiency may be further enchanced to the desired value by either further treating the film with a particular class of liquids that process the hologram, or heating the film, as described hereinafter. These enhancement techniques will increase the reflection efficiency, generally two or three fold, with no apparent detrimental effects. Concurrently, the holographic mirror can reflect light over a broader bandwidth and the filter provides greater protection.

LIQUID ENHANCEMENT

The class of liquids that are particularly effective in enhancing reflection holograms are organic liquids which swell the hologram, e.g., alcohols, ketones, esters, glycol alkyl esters, etc. Use of one or more such enhancing agents is generally all that is required to effect image enhancement. The enhancing agent may be a single liquid or a mixture of such liquids of varying activity. Diluents, e.g., water, hydrocarbon solvents, can be present to decrease the concentration of the enhancing agent. Diluents are "inert solvents" which, when they are applied alone to the holograms surface, have substantially no effect on reflection efficiency. Diluted enhancing agents are used in the instance when limited equilibrated enhancement is desired at lower than maximum reflectance, or when use of the enhancing agent alone causes some dissolving of the hologram. Additional treatment of such limited equilibrated enhancement is possible with a more concentrated or more active enhancing agent.

Enhancing agent typically is applied after the reflection hologram has been fixed by uniform actinic exposure. The reflection hologram may be immersed in the enhancing agent or may be applied by other means. The procedure for applying the enhancing agent to the imaged holographic recording medium generally is controlled to obtain a uniform enhancement of the reflection hologram and to prevent damage to the polymeric image, which is softened by the swelling action of the enhancing agent. Ideally, just sufficient enhancing agent is needed to uniformly wet the image surface without either flooding it or applying tangential or compressive forces. However, since the rate of enhancement of the diluted agents is slower and can be repeated, uniformity can be insured by multiple applications. Any method may be used to uniformly apply the enhancing agent to the hologram provided the method does not entail abrasive or compressive forces which would distort or mar the image.

A satisfactory method of applying the enhancing agent is by lightly drawing across the image area the edge of a paint brush or other applicator such as a foraminous wick, soaked in enhancing agent. If the image area is small this procedure might be accomplished with a small brush or a felt-tip pen. If the image area is large, a felt-edge squeegee of sufficient length might be used. In either case the enhancing agent is supplied uniformly from the applicator to the hologram and is absorbed into the hologram to increase its reflection efficiency. In place of felt, any foraminous material may be used such as paper, and woven and nonwoven fabrics. Similarly, the enhancing agent may be applied as a mist, e.g., using an airbrush; or carefully coated as a liquid film. Excess enhancing agent that my be present is removed from this hologram by known means. Normal evaporation or speeded evaporation by air impingement using air at ambient temperature or elevate temperature are useful in removing excess enhancing agent. The enhancing agent may also be removed by treating with diluent nonenhancing agent.

Particularly useful enhancing agents useful in this invention include: glycol alkyl ethers, e.g., 2-methoxyethanol, 2-ethoxyethanol and 2-butoxyethanol; alcohols, e.g., methanol, ethanol, butanol, 1- or 2propanol; ketones, e.g., acetone, methyl ethyl ketone, cyclohexanone, etc.; and esters, e.g., ethyl acetate, etc. Diluents that may be present with the aforementioned enhancing agent include: water; inert hydrocarbon solvent, e.g., a mixture of $C_{8-10}$ isoparaffins with a boiling point range of 116°-159° C., hexane; cyclohexane; heptane; 1,2-dichloroethane; trichlorotrifluoroethane; and the like.

Typically, maximum enhancement of the entire film is desired, requiring full strength treatment of the film by a highly active agent for a duration to reach in increased equilibrated reflection efficiency. Surprisingly, the reflection efficiency remains at the equilibrated value even after excess agent has been removed. In those instances where immersion is not used or where isolated areas of the film are to be enhanced, controlled methods of application identified above may be used to prevent flooding of the hologram surface and retain the agent in the desired isolated area.

It has been found that liquid enhancement works best with films that have not been thermally enhanced (described below). Liquid enhancement increases refractive index modulation and shifts playback wavelength to a higher value. It also has been found that the shift in playback wavelength achieved by liquid enhancement tends to be reversible to the extent that the liquid may subsequently evaporate from the film. Accordingly, it may be desired to select liquid that will remain in the film, once absorbed, or to provide an impervious cover layer over the treated film.

THERMAL ENHANCEMENT

Reflection holograms formed using the unique films of this invention may be thermally treated to irreversibly enhance reflection efficiency up to about 100%. In this embodiment, a reflection holographic mirror is first formed in the film as described above. The film is then heated to a temperature above 50° C., and preferably between 80° C. and 160° C., for a commensurate time period to maximize enhancement. Two to three fold improvements in refractive index modulation are readily achieved. Thermal enhancement treatment may be carried out either before or after the image is fixed by flooding the film with actinic radiation as described above, but typically it is carried out after the fixing step. The thermal treatment may concurrently fix the enhanced hologram by thermally hardening or polymerizing the photopolymerizable material in the hologram. Both the rate of thermal enhancement and the rate of thermal hardening increase with increasing temperature, with most of the benefits being achieved during early stages. For example, when using a 100° C. enhancement temperature most of the enhancement occurs during the first 5 to 10 minutes, with little further improvement occurring after one hour.

In the practice of this embodiment of the invention, the reflection hologram is heated by any conventional method. For example, the film may be heated in a simple convention oven, irradiated with infrared or microwave radiation, or contract heated on a hot shoe or in a lamination press. Whichever means is used, care is needed to prevent distortion or damage to the photopolymer layer containing the reflection hologram or the substrate layer.

Thermal enhancement is particularly useful in the preparation of holographic notch filters. Since these structures may be attached to complex optical surfaces, it generally is more convenient to image the film to contain the holographic mirror prior to lamination to the substrate, rather than after lamination. Thus, sufficient heat may be applied during lamination to thermally enhance the holographic mirror.

After removal of the temporary support, the film-substrate laminate may be used as a holographic notch filter. However, for applications, in which protection from more than one laser wavelength is desired, one or more additional films, each of which has been imaged to reject a different wavelength, may be laminated to the initial film-substrate laminate. In general, it will be more convenient to laminate the additional films on top of the initial film, but a second film could be laminated to the substrate as well. If an extremely high optical density is desired, additional films which have been imaged to reject the same wavelength as the intitial film may be laminated to the film-substrate laminate. To provide protection form more than one wavelength of laser radiation, it may also be possible, in some circumstances, to record more than one mirror in a single piece of film.

TREATMENT WITH LIQUID MONOMER

It also has been found that optical properties of the reflection hologram, such as reflection efficiency, tend to be stabilized against degradation over time if the film is treated with a solution containing liquid monomer after the reflection hologram has been formed, and preferably after thermal enhancement. In this treatment the film surface is exposed to the liquid monomer solution by immersion, spraying, or similar techniques to allow the monomer to be absorbed into the film. The monomer may be the same monomer contained in the film composition, or a different liquid monomer. The film is then dried, and the absorbed monomer is polymerized by exposing the film to actinic radiation, such as ultraviolet and/or visible light. This treatment not only has a stabilizing effect on the optical properties, but also increases the spacing between interference fringe planes, thereby causing the holographic mirror to reflect a longer wavelength of light. Reflection efficiency may also be affected. Thus, through the selection of particular liquid monomers, carrying solvent, and soak time before polymerization it is possible to permanently modify the holographic properties of the film.

SHIFT IN WAVELENGTH OF RESPONSE

If desired, the film may contain a relatively volatile agent during the imaging step, which is subsequently removed after imaging. In this embodiment the spacing between the fringes of the holographic mirror is reduced when the agent is removed, causing the film to reflect shorter wavelength radiation than was used to form the mirror. This effect can be achieved by the selection of solvents or plasticizers that are compatible with the selected film composition, and which can be removed by evaporation or during heat processing of the film.

The wavelength of response may be shifted by diffusing a nonvolatile plasticizer or monomer into the imaged and processed hologram. The is conveniently carried out by laminating a diffusion element containing binder and monomer and/or plasticizer to the film containing the imaged and processed hologram and allowing diffusion to take place. The diffusion element may be a piece of unexposed film or it may contain other monomers and/or plasticizers. The laminated film and diffusion element may be heated during diffusion, or diffusion may be carried out at room temperature. To stop diffusion, the diffusion element may be removed or, if it is desired that diffusion go to equilibrium, it may be left in place. If the diffusion element contains a monomer, diffusion may be stopped by heating the laminate and/or exposing it to actinic radiation.

EVALUATION OF CANDIDATE FILMS

To evaluate candidate films, holographic mirrors are prepared and thermally processed. Values are determined for film thickness, wavelength of maximum reflection, reflection efficiency at the wavelength of maximum reflection, bandwidth at half maximum, and film speed. Refractive index modulation (M) is then calculated from the reflection efficiency at the wavelength of maximum reflection and film thickness.

Film elements are prepared comprising, in order: clear polyethylene terephthalate film support; a dried layer of the candidate photopolymerizable composition having a thickness of 15 to 35 micrometers; and a polyethylene terephthalate coversheet. Film elements are cut into uniform sections, the coversheet is removed, and the film is then mounted by laminating the soft, tacky coating onto a clear glass plate. The film support is left in place to protect the photopolymerizable composition during exposure and handling operations.

Holographic mirrors are formed in the candidate film compositions mounted on front-surface mirrors with a thin layer of xylene in between, using the "on-axis" technique previously described, by exposure to the TEM$_{oo}$ mode of a collimated 488 nm or 514 nm argon-ion laser beam oriented perpendicular to the film plane and reflecting back on itself. In some cases a thin layer of xylene is placed between between the front-surface mirror and the candidate film. After exposure to record the holographic mirror, the film element is overall exposed to ultraviolet and visible light. The exposed film element is heat processed by placing it in a conventional forced-air convection oven, generally at about 100° C., for 30 to 60 min. The transmission spectrum of each holographic mirror is recorded from 400-700 nm using a conventional spectrophotometer.

The intensity of light transmitted through the film at the wavelength of maximum reflection ($I_{trans}$) is measured as well as the intensity of light transmitted through the film in areas where there is no holographic image ($I_O$). Maximum reflection efficiency ($\eta$) is calculated from the formula:

$$\eta = 1 - (I_{trans}/I_O)$$

Refractive index modulation (M) of the holographic mirror formed in the candidate composition is calculated from the maximum reflection efficiency using Kogelnik's coupled wave theory (H. Kogelnik, *Bell Syst. Tech. J.*, 48, 2909-2947, 1969), which for an unslanted holographic mirror in which the incident radiation is perpendicular to the plane of the mirror, is represented by the formula:

$$\eta = \tanh^2\left[\frac{\pi M d}{\lambda}\right]$$

where
$\eta$ = maximum reflection efficiency;
M = refractive index modulation;
$\lambda$ = probe radiation wavelength in free space; and
d = mirror (i.e, film) thickness.

Solving this equation for M, refractive index modulation is calculated as:

$$M = \left[\frac{\lambda \tanh^{-1}\sqrt{\eta}}{\pi d}\right]$$

Refractive index modulation represents the magnitude of difference in refractive index within the film after it has been imaged and processed to contain a holographic mirror. It is not thickness dependent, but describes the inherent capability of the film composition to record refractive index changes, i.e, holograms. Films having higher refractive index modulations will have higher reflection efficiencies and band widths at the same thickness.

Useful film compositions which may be selected in practicing this invention have a refractive index modulation of at least 0.01, and generally will be at least 0.025 in order to achieve high reflection (i.e., rejection) efficiency while minimizing film thickness. Compositions having a refractive index modulation higher than 0.025 are particularly useful. With these films optical densities of higher than 2, and generally in the order of 3 or greater, are readily achieved at film thicknesses of 10 to 100 micrometers that are particularly useful for the fabrication of holographic notch filters. From the formula provided above it is readily computed that 10 and 25 micrometer films having a refractive index modulation of 0.03 will have reflection efficiencies of 90% and 99.96%, respectively, which correspond to optical densities of 1.0 and 3.4. In contrast, prior art photopolymer compositions proposed by Haugh for holographic applications typically will have a refractive index modulation of 0.001 or less in reflection, and holographic mirrors produced from these compositions typically have reflection efficiencies no higher than 10%, corresponding to an optical density of 0.046, at comparable thicknesses.

HOLOGRAPHIC NOTCH FILTERS

To produce a holographic notch filter the film is mounted on a permanent substrate. In general, the film will be mounted on the substrate after it as been imaged and processed although, it may be equally desirable to coat, laminate, or transfer the film directly onto the permanent substrate and image and process the film on the substrate. Alternatively, the film may be imaged on the support, transferred to the substrate, and processed. The imaged film, processed or unprocessed, may be pressure laminated to the substrate or may be attached with a transparent optical adhesive. If the unprocessed film is laminated to the substrate with heat, the lamination and thermal processing steps may be carried out at the same time. Simple filters can be exposed using the on-axis technique; more complex filters, designed to protect eyes from radiation incident from a variety of angles, require more sophisticated optical design using complex wavefronts.

The substrate must be dimensionally stable and transparent to visible radiation in the case of glasses for eye protection or to the wavelength region which the instrument is designed to detect in the case of sensors and other optical instruments. In addition it must be environmentally stable, compatible with the film, and stable to the selected thermal conditions used to process the film. Useful substrates are glass, quartz, polymethyl methacrylate, polycarbonate, and polystyrene. Polycarbonate is the preferred substrate for military applications because it is light weight and also offers ballistic protection.

To produce a holographic notch filter that will reject more than one wavelength of radiation, additional films that have been exposed and processes to reject different wavelengths of radiation may be mounted on top of the film attached to the permanent substrate. Alternatively, the film may be imaged to contain more than one hologram, each of which rejects a different wavelength. The films may be pressure laminated together or may be attached with a transparent optical adhesive. Alternatively, to achieve this objective a film may be mounted on the permanent substrate, imaged, and processed and additional films mounted, imaged and processed on top of the previously processed film. In addition holographic notch filter may be combined with other types of filters, such as those containing infra-red absorbing dyes, to produce filters which reject more than one wavelength.

Optionally, the film may be covered with a protective coating to protect it from damage, such as scratches and abrasion. The protective material must be transparent, scratch resistant, and compatible with the film. Glass or plastics, such as polyethylene terephthalate or Acclar ® (a fluorinated polymer film manufactured by Allied), may be used as protective coatings. It may be laminated to the film or attached with a transparent optical adhesive. Thermoplastic material can be molded in place to the notch filter.

The holographic notch filter only reflects (i.e., rejects) radiation having a narrow bandwidth that is determined by the wavelength of coherent radiation that was used to image the film, the imaging geometry, and the subsequent processing of the film. Thus, most of the broad spectrum of radiation in front of the filter passes through the filter to the viewer or to the sensor or other optical instrument even though the filter is mounted in the field of vision.

EXAMPLES

GLOSSARY

| | |
|---|---|
| DEAW | Cyclopentanone, 2,5-bis[[4(diethyl-amino)-2-methylphenyl]methylene]- |
| FC-430 | Fluorad ® FC-430, liquid nonionic surfactant; fluoroaliphatic polymeric esters; CAS 11114-17-3; 3M Company |
| MMT | 4-Methyl-4H-1,2,4-triazole-3-thiol; CAS 24854-43-1 |
| NVC | N-Vinyl carbazole; 9-vinyl carbazole; CAS 1484-13-5 |
| o-Cl-HABI | 1,1'-Biimidazole, 2,2'-bis[o-chlorophenyl]-4,4',5,5'-tetraphenyl-; CAS |
| Photomer ® 4039 | Phenol ethoxylate monoacrylate; CAS 56641-05-5; Henkel Process Chemical Company |
| Sartomer 349 | Ethoxylated bisphenol A diacrylate; CAS 24447-78-7; Sartomer Company, West Chester, PA. |
| Vinac ® B-100 | Poly(vinyl acetate); M. W. 350,000; CAS 9003-20-7; Air Products |

GENERAL PROCEDURES

Film Preparation

The coating solution was prepared and handled under yellow light. All components were used as received from the suppliers without further purification.

Sample Evaluation

Coated film with both the film support and coversheet intact was cut into 4×5-inch (10×13 cm) sections. The coversheet was removed, and the film was then mounted by laminating the soft, tacky coating onto a clear glass plate. The film support was left in place during exposure and processing operations. For holographic imaging exposures, the plates were clamped to a front surface mirror with a thin layer of xylene in between, where indicated. The thin layer of xylene served to optically couple the glass and mirror to the film. Holographic mirrors were recorded in the film by exposing with a collimated 488 or 514 nm argon-ion laser beam oriented perpendicular to the film surface so that the beam passed, in order, through the glass plate, coating, film support, and xylene layer and then reflected back onto itself off the mirror surface. The laser beam diameter was 2.0-3.0 cm and its intensity at the sample was about 10 mW/cm$^2$.

After the recording the holographic mirrors, the film samples were overall exposed to ultraviolet and visible light using using the output of a Theimer-Strahler #5027 mercury-arc photopolymer lamp (Exposure Systems Corp., Bridgeport, CT) mounted in a Douthitt DCOP-X (Douthitt Corp., Detroit, MI) exposure unit. The exposed coatings were then heat processed by placing them in a conventional forced-air convection oven at 100° C. for 30 to 60 min.

The transmission spectrum of each holographic mirror was recorded from 400-700 nm using Perkin Elmer model Lambda-9 and model 330 spectrophotometers. Maximum reflection efficiency, reflection wavelength, and bandwidth at half maximum (fwhm) were determined from the transmission spectra. Photospeed was determined from plots reflection efficiency versus exposure energy by choosing the minimum energy needed to obtain maximum efficiency. Coating thickness was measured in processed and analyzed holographic mirrors using a profilometer (Sloan-Dektac Model 3030). The coating thickness, reflection wavelength, and maximum attainable reflection efficiency were used to calculate the refractive index modulation for each coating using the coupled wave theory (Kogelnik's theory).

EXAMPLE 1

This example illustrates the formation of a multilayer holographic notch filter by laminating heat-processed holographic mirrors onto a polycarbonate substrate.

A composition containing 66.0% Vinac ® B-100, 0.03% DEAW, 0.20% FC-430, 2.1% MMT, 3.7% o-Cl HABI, 3.0% Sartomer 349, 7.9% NVC, and 17.0% Photomer ® 4039 was extrusion die coated from a mixture of dichlolomethane (97%) and methanol (3%) to produce a 25.0 micron thick coating. The coating solution was 17.5% total solids. (It should by understood that "total solids" refers to the total amount of non-volatile components in the composition even though some of the components may be non-volatile liquids rather than solids at room temperature.)

The composition was coated onto 2-mil (0.05 mm) thick clear polyethylene terephthalate film support. The solvent was evaporated by passing the coated film through a drier. A coversheet 0.92-mil (0.02 mm) polyethylene terephthalate film was laminated to the coating as it emerged from the drier. Coated samples were stored in black polyethylene bags at room temperature until used.

A sample was imaged at 514 nm with the coversheet and support in place, post-exposed, and heat processed by heating at 100° C. for 1 hr as described in the general procedures. The coversheet was removed and the imaged film laminated onto polycarbonate sheet (Rhom Co., 1.2 mm thick) with a Riston ® HRL-24 laminator at 80° C. at 40 psi. After the sample had cooled, the polyester support sheet was removed and a second piece of imaged film, which had been exposed and processed in the same manner as the first imaged film, laminated to the first film by removing its coversheet and laminating the exposed photopolymer layer to the exposed photopolymer layer of the first piece of imaged film. The support of the second piece of film was retained as a protective layer.

Before lamination the first mirror had a maximum optical density of 3.32 at 523.4 nm and a refractive index modulation of 0.030. The second mirror had a maximum optical density of 3.16 at 525.7 nm and a refractive index modulation of 0.029. The multilayer holographic notch filter had a measured maximum optical density of greater then 4.16 at 522.8 nm, the highest optical density which could be measured with the spectrophotometer. This corresponds to a transmission of less than 0.01% of the incident radiation at the wavelength of maximum absorption. The maximum optical density, calculated from the sum of the optical densities of the two mirrors is about 6.4, corresponding to a transmission of less than 0.0001% of the incident radiation at the wavelength of maximum absorption.

EXAMPLES 2-3

This example illustrates that, in forming holographic notch filters, the thermal processing step can be carried out either before or after lamination to the polycarbonate substrate.

Following the procedure of Example 1, a sample was imaged at 514 nm with the coversheet and support in place, post-exposed, and heat processed by heating at 80° C. for 50 min as described in the general procedures. Then it was laminated onto polycarbonate sheet as described in Example 1. The resulting holographic notch filter had a maximum optical density of 3.09 at 519.3 nm, and a refractive index modulation of 0.028.

Following the procedure of Example 1, a sample was imaged at 514 nm with the coversheet and support in place and laminated onto a polycarbonate substrate as described in Example 1. Then the laminated mirror and polycarbonate substrate was heat processed by heating at 80° C. for 50 min as described in the general procedures. The resulting holographic notch filter had a maximum optical density of 1.28 at 514.7 nm, and a refractive index modulation of 0.014.

EXAMPLE 4

This example illustrates that the formation of a multi-layer holographic notch filter with two absorption maxima by laminating heat-processed holographic mirrors exposed at different wavelengths onto a polycarbonate substrate.

Following the procedure of Example 1, two samples were imaged at 488 nm with the coversheet and support in place, post-exposed, heat processed, and laminated onto polycarbonate sheet forming a multilayer filter. Exposure was carried out with the incident radiation about 17° from normal. Then a second set of two samples, which were imaged at 514 nm and processed by the same procedure, was laminated together as in the first sample as described in Example 1. Again exposure was carried out with the incident radiation about 17° form the normal. The resulting holographic notch filter had a maximum optical density of greater than 5.08 at 515.3 nm and greater than 3.82 at 490.2 nm.

Having described the invention, we now claim the following and their equivalents.

What is claimed is:

1. A holographic notch filter comprising a transparent substrate that bears a transparent polymeric film containing a reflection hologram, said reflection hologram having an optical density of greater than approximately 2 at the wavelength of maximum reflection and said film, prior to recording of the hologram, consisting essentially of:
   (a) approximately 25 to 75% of a polymeric binder selected from the group consisting of polyvinyl acetate, polyvinyl butyral, polyvinyl acetal, polyvinyl formal, interpolymers containing major segments thereof, and mixtures thereof;
   (b) approximately 5 to 60% of an ethylenically unsaturated liquid monomer containing at least one phenyl, biphenyl, phenoxy, naphthyl, naphthyloxy, heteroaromatic groups containing up to three aromatic rings, chlorine or bromine moiety;
   (c) approximately 0 to 25% of a plasticizer; and
   (d) approximately 0.1 to 10% of a photoinitiator system activatable by actinic radiation;
   wherein said percentages are weight percentages based on total film weight.

2. The holographic notch filter of claim 1 wherein the filter has an optical density of at least approximately 3 at the wavelength of maximum reflection.

3. The holographic notch filter of claim 1 wherein the transparent substrate is selected from the group consisting of glass, quartz, polymethyl methacrylate, polycarbonate, and polystyrene.

4. The holographic notch filter of claim 1 additionally comprising one or more transparent polymeric films.

5. The holographic notch filter of claim 1 additionally comprising a protective layer attached to the transparent polymeric film.

6. The holographic notch filter of claim 1 wherein the hologram has a refractive index modulation greater than approximately 0.01.

7. The holographic notch filter of claim 6 wherein the ethylenically unsaturated monomer is selected from the group consisting of 2-phenoxyethyl acrylate, 2-phenoxyethyl methacrylate, phenol ethoxylate monoacrylate, 2-(1-naphthyloxy)ethyl acrylate, o-biphenyl methacrylate, o-biphenyl acrylate, and mixtures thereof.

8. The holographic notch filter of claim 6 wherein the components are present in the following approximate weight ranges: binder, 45 to 75%; monomer, 15 to 50%; and plasticizer, 0 to 15%.

9. The holographic notch filter of claim 8 wherein the hologram has a refractive index modulation of greater than approximately 0.025.

10. The holographic notch filter of claim 6 wherein the transparent substrate is selected from the group consisting of glass, quartz, polymethyl methacrylate, polycarbonate, and polystyrene.

11. The holographic notch filter of claim 6 additionally comprising one or more transparent polymeric films.

12. The holographic notch filter of claim 6 additionally comprising a protective layer attached to the transparent polymeric film.

13. The holographic notch filter of claim 6 wherein the film has a thickness in the range of approximately 10 to 100 micrometers.

14. The notch filter of claim 1 comprising a plurality of polymeric films imaged to reflect light having different wavelengths.

15. The notch filter of claim 1 wherein the polymeric film is imaged to reflect light having different wavelengths.

16. The holographic notch filter of claim 1 wherein a solid monomer is present with said liquid monomer.

17. The holographic notch filter of claim 16 wherein said solid monomer is selected from the group consisting of N-vinyl carbazole, 3,6-dibromo-9-vinyl carbazole, 2,4,6-tribromophenyl acrylate or methacrylate, pentachlorophenyl acrylate or methacrylate, 2-vinyl naphthalene, 2-naphthyl acrylate or methacrylate, 2-(2-naphthyloxy)ethyl acrylate or methacrylate, para-biphenyl methacrylate, t-butylphenyl methacrylate, di-(2-acryloxyethyl)-ether of tetrabromo-bisphenol-A and mixtures thereof.

18. The holographic notch filter of claim 17 wherein the filter has an optical density of at least approximately 3 at the wavelength of maximum reflection.

19. The holographic notch filter of claim 7 wherein a solid monomer is present with said liquid monomer.

20. The holographic notch filter of claim 19 wherein said solid monomer is selected from the group consisting of of N-vinyl carbazole, 3,6-dibromo-9-vinyl carbazole, 2,4,6-tribromophenyl acrylate or methacrylate, pentachlorophenyl acrylate or methacrylate, 2-vinyl naphthalene, 2-naphthyl acrylate or methacrylate, 2-(2-naphthyloxy)ethyl acrylate or methacrylate, para-biphenyl methacrylate, t-butylphenyl methacrylate, di-(2-acryloxyethyl)ether of tetrabromo-bisphenol-A, and mixtures thereof.

21. The holographic notch filter of claim 20 wherein the filter has an optical density of at least approximately 3 at the wavelength of maximum reflection.

* * * * *